United States Patent
Zeng et al.

(10) Patent No.: US 9,461,066 B2
(45) Date of Patent: Oct. 4, 2016

(54) THIN FILM TRANSISTOR AND METHOD OF MANUFACTURING THE SAME, ARRAY SUBSTRATE AND DISPLAY DEVICE

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Mian Zeng, Beijing (CN); Yongjun Yoon, Beijing (CN); Zhizhong Tu, Beijing (CN); Jaikwang Kim, Beijing (CN)

(73) Assignees: BOE Technology Group Co., Ltd., Beijing (CN); Hefei BOE Optoelectronics Technology Co., Ltd., Hefei, Anhui (CN)

( * ) Notice: Subject to any disclaimer, the term of this patent is extended or adjusted under 35 U.S.C. 154(b) by 0 days.

(21) Appl. No.: 14/404,061

(22) PCT Filed: Dec. 10, 2013

(86) PCT No.: PCT/CN2013/089020
§ 371 (c)(1),
(2) Date: Nov. 26, 2014

(87) PCT Pub. No.: WO2015/043082
PCT Pub. Date: Apr. 2, 2015

(65) Prior Publication Data
US 2015/0333181 A1    Nov. 19, 2015

(30) Foreign Application Priority Data
Sep. 29, 2013 (CN) .......................... 2013 1 0456840

(51) Int. Cl.
*H01L 27/00* (2006.01)
*H01L 29/00* (2006.01)
(Continued)

(52) U.S. Cl.
CPC ............. *H01L 27/12* (2013.01); *H01L 27/124* (2013.01); *H01L 27/1225* (2013.01);
(Continued)

(58) Field of Classification Search
CPC .................... H01L 29/7869; H01L 29/66969; H01L 29/78606; H01L 27/124; H01L 27/1259; H01L 27/1225
See application file for complete search history.

(56) References Cited

U.S. PATENT DOCUMENTS 7,348,598 B2    3/2008  Oana
7,692,193 B2 *  4/2010  Lee ..................... H01L 27/1214
                                                   257/40

(Continued)

FOREIGN PATENT DOCUMENTS

CN        1870296 A     11/2006
CN      101562196 A     10/2009
(Continued)

OTHER PUBLICATIONS

Chinese Office Action of Chinese Application No. 201310456840.4, mailed Jul. 10, 2015 with English translation.
(Continued)

*Primary Examiner* — Nikolay Yushin
(74) *Attorney, Agent, or Firm* — Collard & Roe, P.C.

(57) ABSTRACT

A thin film transistor and a method of manufacturing the same, an array substrate and a display device are provided, the thin film transistor including: a source, a drain, and a gate; and a semiconductor active layer, wherein the source overlays a periphery of the semiconductor active layer, the drain is located in a central region of the semiconductor active layer, and an insulation layer is disposed between the source and the drain. By means of the above thin film transistor, the ratio of width to length of a channel can be increased without influencing the aperture ratio of pixel.

12 Claims, 5 Drawing Sheets

(51) Int. Cl.
*H01L 27/12* (2006.01)
*H01L 29/786* (2006.01)
*H01L 29/66* (2006.01)

(52) U.S. Cl.
CPC .... *H01L 27/1259* (2013.01); *H01L 29/66969* (2013.01); *H01L 29/786* (2013.01); *H01L 29/7869* (2013.01); *H01L 29/78606* (2013.01)

(56) References Cited

U.S. PATENT DOCUMENTS

| | | | | |
|---|---|---|---|---|
| 8,305,528 | B2* | 11/2012 | Wang | G02F 1/133555 349/114 |
| 8,604,470 | B2* | 12/2013 | Yim | H01L 29/7869 257/43 |
| 8,872,179 | B2* | 10/2014 | Tsubuku | H01L 29/78693 257/43 |
| 2001/0050368 | A1 | 12/2001 | Moon | |
| 2007/0155080 | A1* | 7/2007 | Yoon | H01L 27/1214 438/197 |
| 2011/0278565 | A1* | 11/2011 | Yim | H01L 29/78693 257/43 |
| 2013/0134422 | A1* | 5/2013 | Tsubuku | H01L 29/78693 257/57 |

FOREIGN PATENT DOCUMENTS

| | | |
|---|---|---|
| CN | 203456471 U | 2/2014 |
| KR | 10-2008-0002186 A | 1/2008 |

OTHER PUBLICATIONS

International Search Report, International Preliminary Report on Patentability and Written Opinion of the International Searching Authority of PCT/CN2013/089020 in Chinese, mailed Jun. 25, 2014.

English Translation of the International Search Report of PCT/CN2013/089020 published in English on Apr. 2, 2015.

English translation of the International Preliminary Report on Patentability and Written Opinion of the International Searching Authority of PCT/CN2013/089020, mailed Mar. 29, 2016.

* cited by examiner

US 9,461,066 B2

THIN FILM TRANSISTOR AND METHOD OF MANUFACTURING THE SAME, ARRAY SUBSTRATE AND DISPLAY DEVICE

CROSS REFERENCE TO RELATED APPLICATIONS

This application is the National Stage of PCT/CN2013/089020 filed on Dec. 10, 2013, which claims priority under 35 U.S.C. §119 of Chinese Application No. 201310456840.4 filed on Sep. 29, 2013, the disclosure of which is incorporated by reference.

TECHNICAL FIELD

Embodiments of the invention relate to thin film transistors and methods of manufacturing the same, array substrates and display devices.

BACKGROUND

A thin film transistor liquid crystal display (TFT-LCD) as a flat panel display device has been used increasingly in the field of high performance display, since it exhibits properties of small volume, low power consumption, zero radiation, relatively low manufacture cost, etc.

The quality of thin film transistors (TFTs) functioning as switch elements is especially important in the TFT-LCD, and a general structure of a TFT may mainly include, as shown in FIG. 1, a source 101, a drain 102, and a gate 103, in which the source 101 and the drain 102 are usually formed using a same layer of metal material, there is further included a semiconductor active layer 11 between regions of source and drain and a gate metal layer, and the semiconductor active layer 11 located over a region of the gate 103 forms a TFT channel 10 (shown by the dashed lines in FIG. 1). In the related art, the material for forming the semiconductor active layer 11 may be amorphous silicon (A-Si). In the TFT having such a structure, mobility is about 0.5 $cm^2/Vs$. However, as the size of a display device is increased gradually, the display device is required to have higher definition and high frequency driving performance. Therefore, the TFT is required to possess high mobility and high performance. In order to enhance the electron mobility of the semiconductor active layer, semiconductor oxide material, e.g., an indium gallium zinc oxide (IGZO), is usually used as the semiconductor active layer of the TFT, which has the electron mobility tens of times higher than that of an amorphous silicon layer.

In the related art, the structure of the TFT using IGZO as the semiconductor active layer 11 may generally adopt a hole type as shown in FIG. 2, in which the source 101 and the drain 102 of the TFT are electrically connected to the IGZO semiconductor active layer 11 through via holes 21 and 22, respectively, or a bar type as shown in FIG. 3, in which the source 101 and the drain 102 of the TFT overlay two sides of the IGZO semiconductor active layer 11. However, the ratio of width to length (W:L) of the TFT channel 10 in the above two structures is relative small, and thus it will take a relative long time for the source and the drain of the TFT to be switched to on-state, which will lower the response speed upon the channel of the TFT turns on down and thereby degrade the display quality of the display device.

SUMMARY

In an embodiment of the invention, a TFT is provided, and the TFT includes a source, a drain, a gate, and a semiconductor active layer, wherein the source overlays a periphery of the semiconductor active layer, the drain is located at a central region of the semiconductor active layer, and an insulation layer is interposed between the source and the drain.

In another embodiment of the invention, an array substrate is provided, and the array substrate includes: a plurality of pixel units defined by gate lines and data lines and arranged in form of a matrix, the pixel units including pixel electrodes; and the above stated TFTs, the sources of the TFTs being electrically connected to the data lines and the drains of the TFTs being electrically connected to the pixel electrodes.

In another embodiment of the invention, a display device is provided and the display device includes the above stated array substrate.

In another embodiment of the invention, a method of manufacturing a TFT is provided, and the method includes: forming a semiconductor active layer on a substrate on which a gate and a gate insulation layer are formed sequentially; forming a metal layer on a surface of the substrate on which the above patterns are formed and forming a source by a patterning process, wherein the source overlays a periphery of the semiconductor active layer and a central region of the semiconductor active layer is exposed; forming an insulation layer on the surface of the substrate on which the above patterns are formed, and forming a via hole in the insulation layer in the central region of the semiconductor active layer by a patterning process; and forming a drain on the surface of the substrate on which the above patterns are formed, the drain covering the via hole.

BRIEF DESCRIPTION OF THE DRAWINGS

For better understanding technical proposals according to embodiments of the present invention, drawings of the embodiments will be described briefly below. Obviously, drawings in the following description only relate to some embodiments of the present invention, not to limit the present invention.

DETAILED DESCRIPTION

In order to make the purpose, technology solution and advantages of embodiments of the present invention more clear, technology solutions according to embodiments of the present invention will be described clearly and completely below with respect to drawings of embodiments of the present invention. It is to be understood that the described embodiments are part of but not all of embodiments of the present invention. Based on the described embodiments of the present invention, all other embodiments obtained by those of ordinary skill in the art without any creative labor fall into the protecting scope of the present invention.

Figure 1:
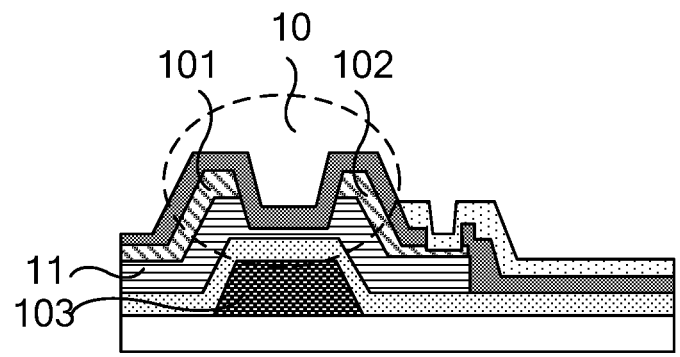
FIG. 1 is a schematic view showing a structure of a TFT in the related art.
Figure 2:
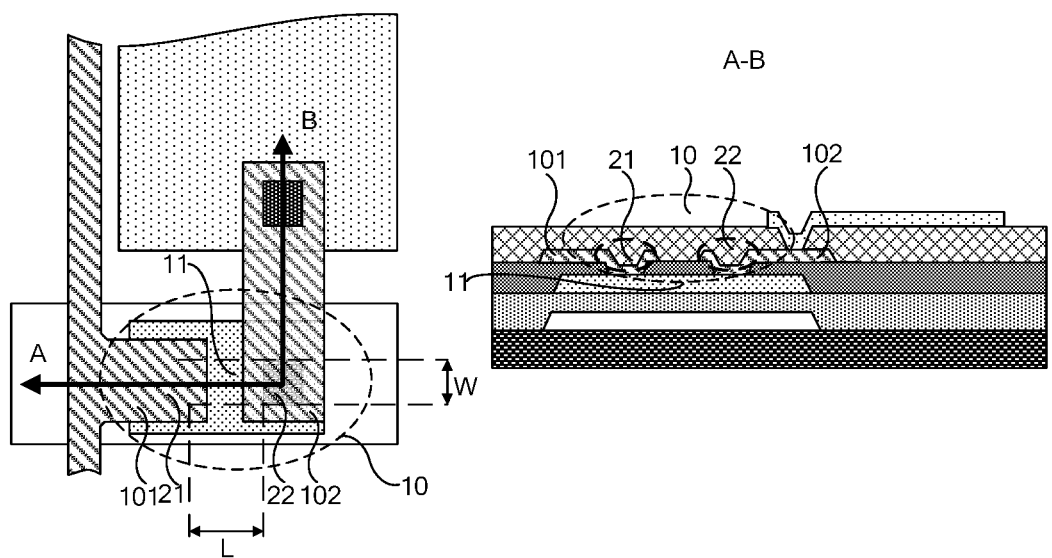
FIG. 2 is a schematic view showing a structure of an array substrate in the related art.
Figure 3:
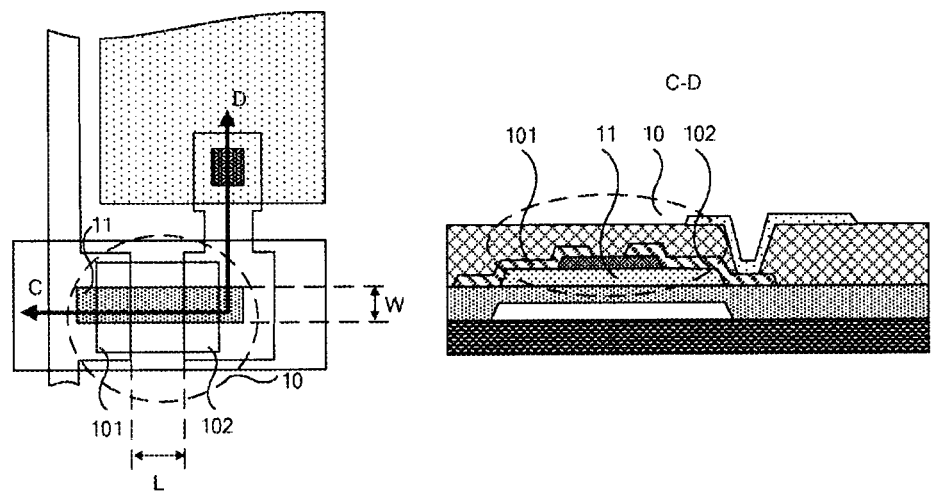
FIG. 3 is a schematic view showing a structure of another array substrate in the related art.
Figure 4:
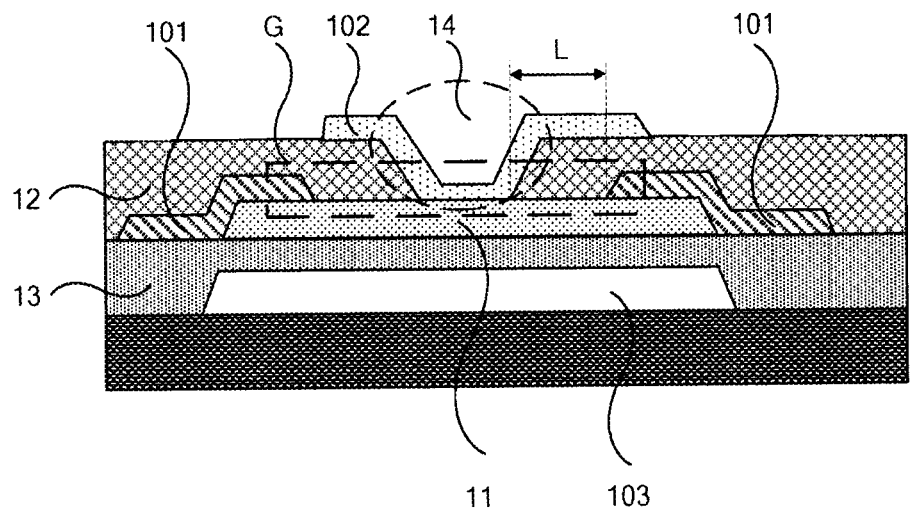
FIG. 4 is a schematic view showing a structure of a TFT provided in an embodiment of the invention.

An embodiment of the invention provides a thin film transistor (TFT), as shown in FIG. 4, which includes a source 101, a drain 102, and a gate 103, and a semiconductor active layer 11; and the source 101 overlays a periphery of the semiconductor active layer 11, the drain 102 is located in a central region G (as shown by a dashed frame in FIG. 4) of the semiconductor active layer 11, and an insulation layer 12 is disposed between the source 101 and the drain 102.

It should be noted that the central region G of the semiconductor active layer 11 may refer to a portion of the semiconductor active layer 11 not covered by the source 101.

The thin film transistor (TFT) provided by the embodiment of the invention includes the source, the drain, and the gate, and the semiconductor active layer. The source overlays the periphery of the semiconductor active layer, the drain is located in the central region of the semiconductor active layer, and the insulting layer is disposed between the source and the drain. In this way, the ratio of width to length of a channel in the TFT may be increased without influencing an aperture ratio of pixel, so as to enhance the response speed when the channel of the TFT turns on and improve the display effect of the display device.

Further, the insulation layer 12 covers the source 101 and the semiconductor active layer 11 from upside thereof, and has a via hole 14 formed over the central region G of the semiconductor active layer 11; and the drain 102 is electrically connected to the semiconductor active layer 11 through the via hole 14 in the central region G of the semiconductor active layer 11.

Figure 5:
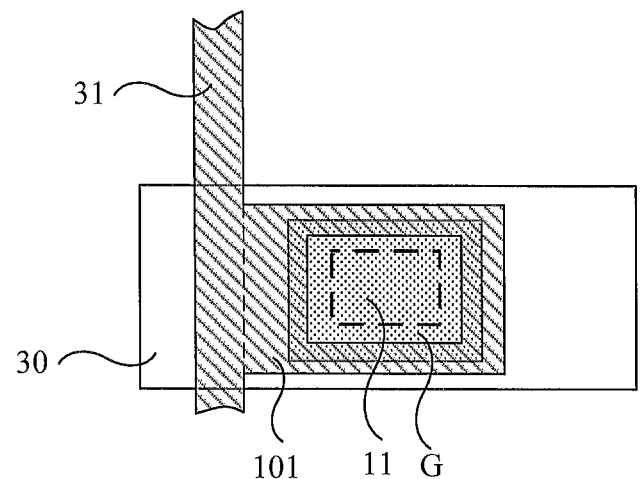
FIG. 5 is a plan schematic view showing a structure of an array substrate provided in an embodiment of the invention.

As shown in FIG. 5, the channel in the TFT having such a structure is of a loop-shaped channel, in which the width of the channel is equal to the perimeter of a cross-section of the via hole 14, and the length of the channel, as shown in FIG. 4, is the distance L from the outer diameter of the via hole 14 to the periphery of the central region G of the semiconductor active layer 11.

Since the width of the TFT having such a structure is the perimeter of the semiconductor active layer 11, the ratio of width to length of the TFT is relative large, so that the time during which the source 101 and the drain 102 of the TFT are switched to on-state will be shortened, and the response speed when the channel of the TFT turns on will be improved. In addition, the length L of the TFT channel may be reduced by increasing the outer diameter of the via hole 14 through a manufacture process or reducing the area of the central region G of the semiconductor active layer 11 without influencing the aperture ratio of pixel, or the width of the TFT channel may be increased by increasing the perimeter of the cross-section of the via hole 14 without influencing the aperture ratio of pixel, and accordingly the response speed when the TFT channel turns on may be enhanced.

In an embodiment of the invention, the semiconductor active layer 11 may be formed of oxide semiconductor material, for example, zinc oxide (ZnO), cadmium oxide (CdO), aluminum oxide ($Al_2O_3$), or indium gallium zinc oxide (IGZO). For example, in an embodiment of the invention, IGZO may be selected to form the semiconductor active layer 11. In this way, as compared to the semiconductor active layer made by using amorphous silicon (A-Si) in the related art, the mobility of the semiconductor active layer formed by using IGZO is tens of times higher than that of the amorphous silicon semiconductor active layer, which exhibits excellent semiconductor properties, and thus can improve the mobility and the performance of the TFT.

Figure 6:
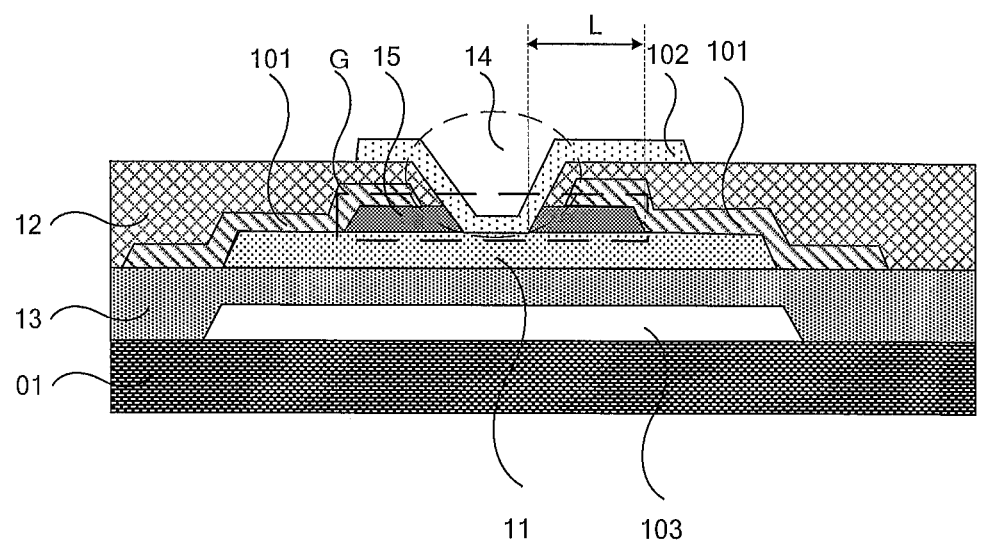
FIG. 6 is a schematic view showing a structure of another TFT provided in an embodiment of the invention.

In addition, in some embodiments of the invention, as shown in FIG. 6, the TFT may further include an etching stop layer 15 located between the source 101 and the semiconductor active layer 11.

The source 101 overlays a periphery of the etching stop layer 15, and the etching stop layer 15 covers the central region G of the semiconductor active layer 11. Since the central region G of the semiconductor active layer 11 needs to be exposed upon forming the source 101, the semiconductor active layer 11 in the central region G may be protected by the etching stop layer 15 during the process for forming the source 101, so as to prevent the semiconductor active layer 11 from being damaged by the patterning processes in the manufacturing processes.

In embodiments of the invention, the patterning processes may include a photolithograph process, or include a photolithograph process and an etching step, and meanwhile may also include other processes such as printing, ink-jetting, etc. for forming predetermined patterns; and the photolithograph process refers to a process that includes process steps such as film formation, exposure, developing, and so on and forms patterns by using photoresist, mask, exposure machine, and so on. A corresponding patterning process may be selected according to the structure formed in an embodiment of the invention.

The width of the channel of the TFT having such a structure is the perimeter of the cross-section of the via hole 14, and the length of the channel is a distance L from the outer diameter of the via hole 14 to a pattern edge of the etching stop layer 15 as shown in FIG. 6. In this way, the length L of the TFT channel may be reduced by increasing the outer diameter of the via hole 14 through a manufacture process, or the area of the etching stop layer 15 may be increased to increase the length of the pattern edge of the etching stop layer 15 without influencing the aperture ratio of the pixel, which will reduce the time that is needed for the source 101 and the drain 102 of the TFT being switched to on-state, and thus improve the response speed when the channel of the TFT turns on.

In embodiments of the invention, the TFT further includes a gate insulation layer 13 located between the gate 103 and the semiconductor active layer 11. In this way, a short circuit between the layers respectively located above and under the gate insulation layer 13 due to electric conduction can be avoided.

Figure 7:
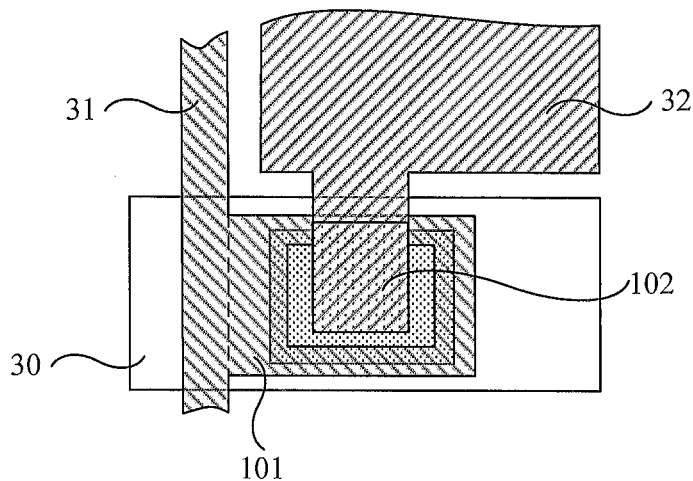
FIG. 7 is a plan schematic view showing a structure of another array substrate provided in an embodiment of the invention.

In another aspect, an embodiment of the invention provides an array substrate, as shown in FIG. 7, which includes: a plurality of pixel units that are defined by gate lines 30 and data line 31 crossing each other and are arranged in form of a matrix, the pixel unit including a pixel electrode 32; and any one of the TFTs described above. The source 101 of the TFT is electrically connected to the data line 31; and the drain 102 of the TFT is electrically connected to the pixel electrode 32.

The array substrate provided in the embodiment of the invention exhibits the same beneficial effects of the TFTs provided in the aforementioned embodiments of the invention, and the TFTs will not be described repeatedly herein since they have been described in detail in the aforementioned embodiments.

The array substrate provided in the embodiment of the invention includes the TFT that includes the source, the drain, and the gate, and the semiconductor active layer. The source overlays the periphery of the semiconductor active layer, the drain is located in the central region of the semiconductor active layer, and there is disposed the insulation layer between the source and the drain. In this way, without influencing the aperture ratio of pixel, the ratio of width to length of the TFT channel may be increased so as to improve the response speed when the TFT channel turns on and improve the display quality of the display device.

In embodiments of the invention, the drain 102 of the TFT and the pixel electrode 32 may have an integral structure. In this way, the drain 102 and the pixel electrode 32 may be formed simultaneously so as to simplify the manufacture process and improve the production efficiency.

An embodiment of the invention further provides a display device, which includes any one of the above array substrates, and exhibits the same beneficial effects of the array substrates provided in the aforementioned embodiments of the invention; and the array substrates will not be described repeatedly herein since they have been described in detail in the aforementioned embodiments.

In the embodiment of the invention, the display device may include at least a liquid crystal display device and an organic light emitting diode display device, for example, the display device may be any product or component with display function, such as a liquid crystal display, a liquid crystal TV, a digital frame, a cell phone, a tablet PC, or the like. The detailed structures of the array substrates have been described in detail in the aforementioned embodiments, and thus will not be described repeatedly herein.

The display device provided in the embodiment of the invention includes the array substrate having the TFTs, and the TFT includes the source, the drain, and the gate, and the semiconductor active layer. The source overlays the periphery of the semiconductor active layer, the drain is located in the central region of the semiconductor active layer, and there is disposed the insulation layer between the source and the drain. In this way, without influencing the aperture ratio of pixel, the ratio of width to length of the TFT channel may be increased so as to improve the response speed when the TFT channel turns on and improve the display quality of the display device.

Figure 8:
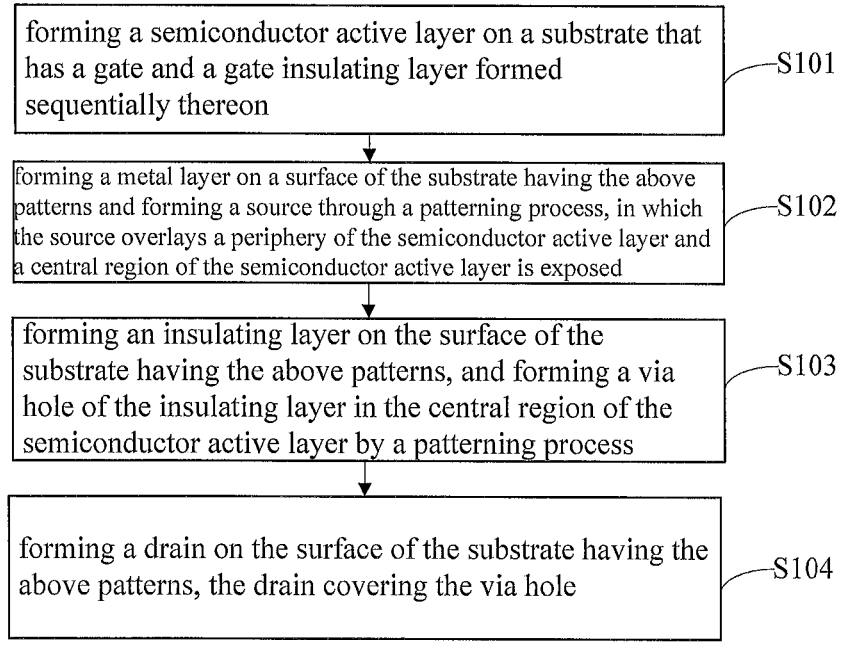
FIG. 8 is a flow chart showing a method of manufacturing a TFT provided in an embodiment of the invention.

An embodiment of the invention provides a method of manufacturing a TFT, as shown in FIG. 8, which includes:

S101, forming a semiconductor active layer 11 on a substrate that has a gate 103 and a gate insulation layer 13 formed sequentially thereon, as shown in FIG. 4;

S102, forming a metal layer on a surface of the substrate having the above patterns formed thereon and forming a source 101 through a patterning process, in which the source 101 overlays a periphery of the semiconductor active layer 11 and a central region G (as shown by the dashed frame in FIG. 4) of the semiconductor active layer 11 is exposed;

S103, forming an insulation layer 12 on the surface of the substrate having the above patterns formed thereon and forming a via hole 14 through the insulation layer 12 in the central region G of the semiconductor active layer 11 by a patterning process;

S104, forming a drain 102 on the surface of the substrate having the above patterns formed thereon, the drain 102 covering the via hole 14.

It should be noted that the central region G of the semiconductor active layer 11 may refer to a portion of the semiconductor active layer 11 not covered by the source 101.

A channel of the TFT having such a structure is of a loop-shaped channel as shown in FIG. 5, in which the width of the channel is the perimeter of a cross-section of the via hole 14, and the length of the channel, as shown in FIG. 4, is the distance L from the outer diameter of the via hole 14 to the periphery of the central region G of the semiconductor active layer 11.

Since the width of the TFT having such a structure is the perimeter of the semiconductor active layer 11, the ratio of width to length of the TFT is relative large, so that the time needed for the source 101 and the drain 102 of the TFT being switched to on-state will be shortened, and thereby the response speed when the channel of the TFT turns on will be improved In addition, by means of a manufacture process, the outer diameter of the via hole 14 may be increased or the area of the central region G of the semiconductor active layer 11 may be reduced without influencing the aperture ratio of pixel, so that the length L of the TFT channel may be reduced; or the perimeter of the cross-section of the via hole 14 may be increased without influencing the aperture ratio of pixel, so that the width of the TFT channel may be increased. In this way, the response speed when the TFT channel turns on may also be improved.

An embodiment of the invention provides a method of manufacturing a TFT, which includes a source, a drain, and a gate, and a semiconductor active layer. The source overlays a periphery of the semiconductor active layer, the drain is located in a central region of the semiconductor active layer, and an insulation layer is disposed between the source and the drain. In this way, the ratio of width to length of a channel of the TFT may be increased without influencing the aperture ratio of pixel, so that the response speed when the channel of the TFT turns on is improved and the display quality of a display device is improved.

In embodiments of the invention, the semiconductor active layer 11 may be made by using oxide semiconductor material, for example, zinc oxide (ZnO), cadmium oxide (CdO), aluminum oxide ($Al_2O_3$), or indium gallium zinc oxide (IGZO). For example, in embodiments of the invention, IGZO may be selected to form the semiconductor active layer 11. In this way, as compared to the semiconductor active layer made by using amorphous silicon (A-Si) in the related art, the mobility of the semiconductor active layer formed by using IGZO is tens of times higher than that of the amorphous silicon semiconductor active layer, which exhibits excellent semiconductor properties, and thus can improve the mobility and the performance of the TFT.

In addition, in some embodiments of the invention, before forming the source 101, the method further includes: forming an etching stop layer 15 on a surface of a substrate having the semiconductor active layer 11 formed thereon by a patterning process. The source 101 overlays a periphery of the etching stop layer 15, and the etching stop layer 15 covers the central region G of the semiconductor active layer 11. Since the central region G of the pattern of the semiconductor active layer 11 needs to be exposed upon forming the source 101, the semiconductor active layer 11 in the central region G may be protected by the etching stop layer 15 during the formation of the source 101, so as to prevent the semiconductor active layer 11 from being damaged by patterning processes in the manufacture processes.

The width of the channel of the TFT having such a structure is the perimeter of the cross-section of the via hole 14, and the length of the channel is a distance L from the outer diameter of the via hole 14 to a pattern edge of the etching stop layer 15 as shown in FIG. 6. In this way, the outer diameter of the via hole 14 may be increased through a manufacture process so as to reduce the length L of the TFT channel, or the area of the etching stop layer 15 may be increased to increase the length of the pattern edge of the etching stop layer 15 without influencing the aperture ratio of the pixel, which will reduce the time that is needed for the source 101 and the drain 102 of the TFT being switched to on-state, and thereby improve the response speed when the channel of the TFT turns on.

Further, the gate insulation layer 13 of the TFT located between the gate 103 and the semiconductor active layer 11 can protect the layers respectively located above and under the gate insulation layer 13 from a short circuit due to electric conduction.

Figure 9:
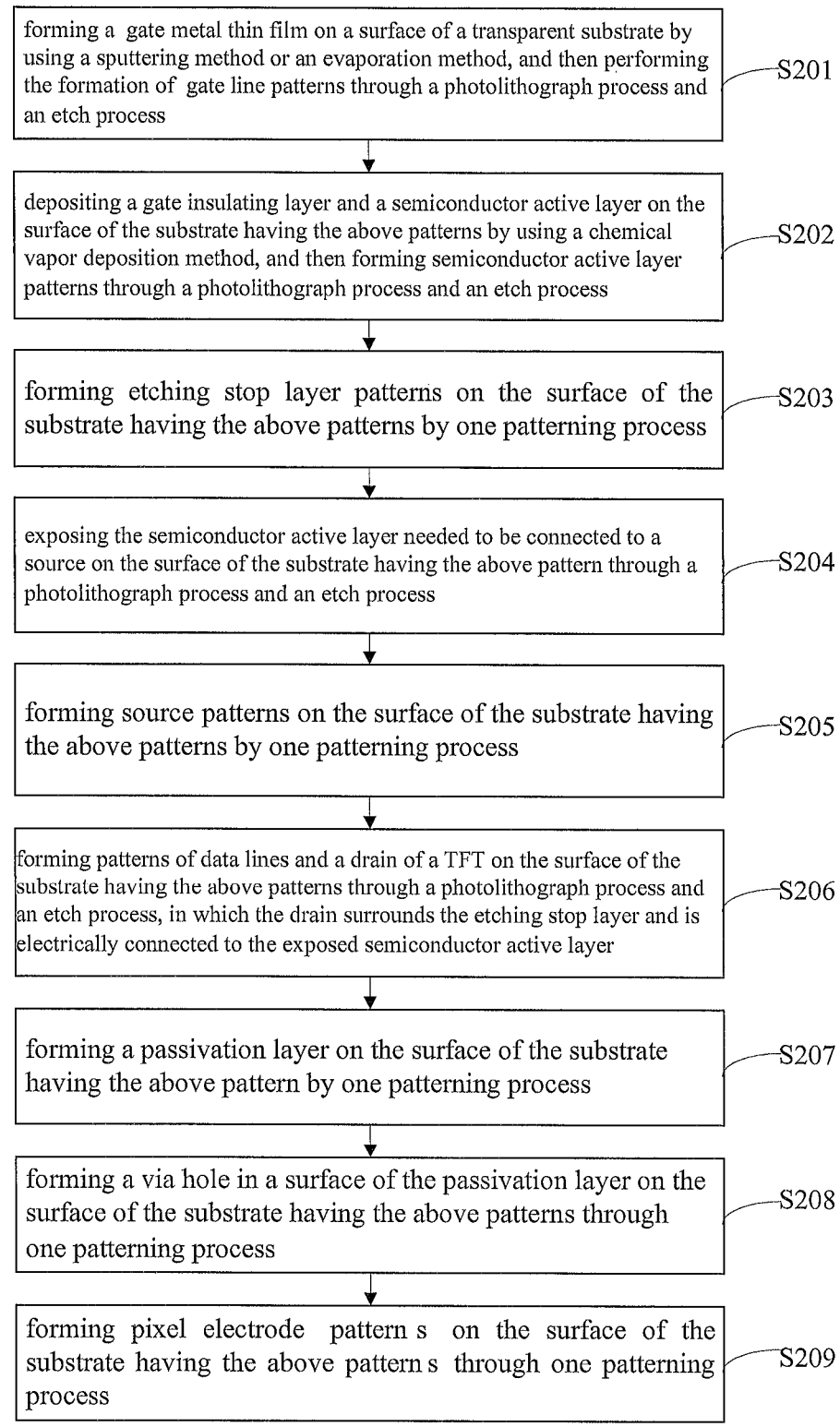
FIG. 9 is a flow chart showing a method of manufacturing another TFT provided in an embodiment of the invention.

Hereinafter, a manufacturing process of an array substrate provided in an embodiment of the invention will be described in detail, taken in conjunction with FIGS. 6, 7, and 9.

S201, a gate metal thin film is formed on a surface of a transparent substrate 01 by using a sputtering method or an evaporation method, and then the formation of a pattern of the gate 103 is performed through a photolithograph process and an etch process.

In embodiments of the invention, the material for forming the gate metal thin film includes in general at least one of molybdenum, aluminum, aluminum nickel alloy, or copper.

S202, the gate insulation layer 13 and the semiconductor active layer 11 are deposited on the surface of the substrate having the above pattern formed thereon by using a chemical vapor deposition method, and then a pattern of the semiconductor active layer 11 is formed through a photolithograph process and an etch process;

In embodiments of the invention, the material for forming the gate insulation layer may include silicon oxide, silicon nitride, silicon oxynitride or the like. The material for forming the semiconductor active layer is of oxide semiconductor, for example, IGZO.

S203, a pattern of the etching stop layer 15 is formed on the surface of the substrate having the above pattern formed thereon by one patterning process.

In embodiments of the invention, the material for forming the etching stop layer 15 may include silicon oxide, silicon nitride, silicon oxynitride, or the like.

S204, the semiconductor active layer 11 needed to be connected to the source 101 is exposed on the surface of the substrate having the above pattern formed thereon through a photolithograph process and an etch process.

S205, the source 101 is formed on the surface of the substrate having the above pattern formed thereon by one patterning process.

In embodiments of the invention, the source 101 may expose the central region G of the semiconductor active layer 11.

S206, a pattern of the data line 31 and the drain 102 of the TFT are formed on the surface of the substrate having the above pattern formed thereon through a photolithograph process and an etch process, in which the drain 102 surrounds the etching stop layer 15 and is electrically connected to the exposed semiconductor active layer 11.

S207, a passivation layer (i.e., the insulation layer 12 in FIG. 6) is formed on the surface of the substrate having the above pattern formed thereon by one patterning process.

In embodiments of the invention, the material for forming the passivation layer may include silicon nitride, silicon oxide, silicon oxynitride, or the like.

S208, the via hole 14 is formed in a surface of the passivation layer on the surface of the substrate having the above pattern formed thereon through one patterning process.

In embodiments of the invention, the via hole 14 is formed by etching the etching stop layer 15 together, so as to expose the central semiconductor active layer.

S209, a pattern of the pixel electrode 32 is formed on the surface of the substrate having the above pattern formed thereon through one patterning process.

In embodiments of the invention, the pixel electrode 32 is electrically connected to the source 101 of the TFT through the via hole 14.

The TFT manufactured by using this method of manufacturing the TFT includes a source, a drain, and a gate, and a semiconductor active layer. The source overlays a periphery of the semiconductor active layer, the drain is located in a central region of the semiconductor active layer, and an insulation layer is disposed between the source and the drain. In this way, the ratio of width to length of a channel of the TFT may be increased without influencing the aperture ratio of pixel, so that the response speed when the channel of the TFT turns on is improved and the display quality of a display device is improved.

The above embodiments are only for the purpose of describing technical proposal of the present invention rather than limiting it. While the present invention has been described in detail with reference to the above-mentioned embodiments, those of ordinary skill in the art should understand that they can modify the technical solution recorded in the above embodiments or conduct equivalent substitution for a part of technical features thereof and these modifications or substitutions will not make the nature of respective technical solution to depart from the spirit and scope of technical solutions of embodiments of the present invention.

The invention claimed is:

1. A thin film transistor including: a source, a drain, and a gate; and a semiconductor active layer, wherein the source overlays a periphery of the semiconductor active layer and covers end portions of the semiconductor active layer, the drain is located in a central region of the semiconductor active layer, and an insulation layer is disposed between the source and the drain, wherein the source is ring-shaped, the thin film transistor further comprising an etching stop layer located between the source and the semiconductor active layer.

2. The thin film transistor of claim 1, wherein the semiconductor active layer is formed by using oxide semiconductor material.

3. An array substrate including: a plurality of pixel units defined by gate lines and data lines and arranged in form of matrix, each of the pixel units comprising a pixel electrode; and the thin film transistor of claim 1, the source of the thin film transistor being electrically connected to the data lines and the drain of the thin film transistor being electrically connected to the pixel electrode.

4. The array substrate of claim 3, wherein the drain of the thin film transistor and the pixel electrode have an integral structure.

5. A display device including the array substrate of claim 3.

6. The thin film transistor of claim 1, wherein the insulation layer covers the source and the semiconductor active layer from upside thereof, and a via hole is formed over the central region of the semiconductor active layer; and the drain is electrically connected to the semiconductor active layer through the via hole located over the central region of the semiconductor active layer.

7. The thin film transistor of claim 6, wherein the source overlays a periphery of the etching stop layer, and the etching stop layer cover the central region of the semiconductor active layer.

8. The thin film transistor of claim 6, wherein the semiconductor active layer is formed by using oxide semiconductor material.

9. The thin film transistor of claim 7, wherein the semiconductor active layer is formed by using oxide semiconductor material.

10. A method of manufacturing a thin film transistor, including:
   forming a semiconductor active layer on a substrate on which a gate and a gate insulation layer are formed sequentially;
   forming an etching stop layer on the surface of the substrate having the semiconductor active layer formed thereon by a patterning process;
   forming a metal layer on a surface of the substrate having patterns formed thereon and forming a source by a patterning process, wherein the source overlays a periphery of the semiconductor active layer and covers end portions of the semiconductor active layer, and a central region of the semiconductor active layer is exposed, wherein the source is ring-shaped;
   forming an insulation layer on the surface of the substrate having the above patterns formed thereon and forming a via hole of the insulation layer in the central region of the semiconductor active layer by a patterning process; and
   forming a drain on the surface of the substrate having the above patterns formed thereon, the drain covering the via hole.

11. The method of claim 10, wherein the semiconductor active layer is formed by using oxide semiconductor material.

12. The method of claim 11, wherein the source overlays a periphery of the etching stop layer and the etching stop layer covers a central region of the semiconductor active layer.

\* \* \* \* \*